(12) United States Patent
Wenski et al.

(10) Patent No.: US 6,793,837 B2
(45) Date of Patent: Sep. 21, 2004

(54) PROCESS FOR MATERIAL-REMOVING MACHINING OF BOTH SIDES OF SEMICONDUCTOR WAFERS

(75) Inventors: Guido Wenski, Burghausen (DE);
Thomas Altmann, Haiming (DE);
Gerhard Heier, Burghausen (DE);
Wolfgang Winkler, Tittmoning (DE);
Gunther Kann, Griesstätt (DE)

(73) Assignee: Siltronic AG, Munich (DE)

( * ) Notice: Subject to any disclaimer, the term of this patent is extended or adjusted under 35 U.S.C. 154(b) by 121 days.

(21) Appl. No.: 10/174,139

(22) Filed: Jun. 18, 2002

(65) Prior Publication Data

US 2003/0054650 A1 Mar. 20, 2003

(30) Foreign Application Priority Data

Jul. 5, 2001 (DE) .......................................... 101 32 504

(51) Int. Cl.⁷ ................................................. B44C 1/22
(52) U.S. Cl. ............................ 216/88; 438/692; 451/57
(58) Field of Search ................................ 438/692, 693; 216/88, 89; 451/57

(56) References Cited

U.S. PATENT DOCUMENTS

| | | | | |
|---|---|---|---|---|
| 4,739,589 A | * | 4/1988 | Brehm et al. .................. | 451/41 |
| 5,855,735 A | | 1/1999 | Takada et al. | |
| 6,001,005 A | * | 12/1999 | Anderson et al. ........... | 451/268 |
| 6,051,498 A | * | 4/2000 | Pietsch et al. ............... | 438/691 |
| 6,180,423 B1 | | 1/2001 | Hashimoto et al. | |
| 6,214,704 B1 | * | 4/2001 | Xin ............................. | 438/471 |
| 6,299,514 B1 | * | 10/2001 | Boller .......................... | 451/262 |
| 6,315,641 B1 | * | 11/2001 | Lee et al. ....................... | 451/41 |
| 6,458,688 B1 | * | 10/2002 | Wenski et al. .............. | 438/626 |
| 6,566,267 B1 | * | 5/2003 | Wenski ........................ | 438/692 |
| 6,583,050 B2 | * | 6/2003 | Wenski et al. .............. | 438/626 |
| 2003/0045089 A1 | * | 3/2003 | Wenski et al. .............. | 438/626 |

FOREIGN PATENT DOCUMENTS

| | | |
|---|---|---|
| DE | 19626396 | 1/1997 |
| DE | 19704546 | 8/1998 |
| DE | 199 19 583 | 11/1999 |
| DE | 10007390 | 10/2000 |
| DE | 19905737 | 12/2000 |
| DE | 19956250 | 5/2001 |
| EP | 208 315 | 9/1990 |
| EP | 547 894 | 5/1996 |
| WO | 00/07230 | 2/2000 |
| WO | 00/36637 | 6/2000 |

\* cited by examiner

Primary Examiner—George A. Goudreau
(74) Attorney, Agent, or Firm—Collard & Roe, P.C.

(57) ABSTRACT

A process is for material-removing machining, on both sides simultaneously, of semiconductor wafers having a front surface and a back surface, the semiconductor wafers resting in carriers which are set in rotation by means of an annular outer drive ring and an annular inner drive ring and being moved between two oppositely rotating working disks in a manner which can be described by means of in each case one path curve relative to the upper working disk and one path curve relative to the lower working disk, wherein the two path curves after six loops around the center have the appearance of still being open, and at each point have a radius of curvature which is at least as great as the radius of the inner drive ring.

14 Claims, 9 Drawing Sheets

PROCESS FOR MATERIAL-REMOVING MACHINING OF BOTH SIDES OF SEMICONDUCTOR WAFERS

BACKGROUND OF THE INVENTION

1. Field of the Invention

The invention relates to a process for material-removing machining of both sides simultaneously of semiconductor wafers using optimized path curves of the semiconductor wafers relative to the upper and lower machining disk.

2. The Prior Art

A typical process sequence for the production of semiconductor wafers comprises the process steps of sawing—edge rounding—lapping or grinding—wet-chemical etching—polishing, as well as cleaning steps before and/or after at least some of the process steps mentioned. Particularly for semiconductor wafers which are to be used as the starting product for the fabrication of modern component generations, for example there are line width requirements of 0.13 μm or 0.10 μm. High demands are imposed on the plane parallelism and flatness of the wafers, which in the cases mentioned above can be expressed by the flatness measure $SFQR_{max}$ less than or equal to 0.13 μm or 0.10 μm for a component surface area of, for example, 25 mm×25 mm. This requirement can be taken into account by at least one manufacturing step in the process sequence being carried out as a step which simultaneously machines the front surface and the back surface of the semiconductor wafers. Examples of such processes include double-side lapping, double-side grinding and double-side polishing, which can be carried out as a single-wafer process or with approximately 5 to 30 semiconductor wafers being machined simultaneously.

The technology of double-side lapping of a plurality of semiconductor wafers simultaneously has long been known and is described, for example, in EP 547 894 A1, and suitable installations are commercially available in various sizes from a number of manufacturers. The semiconductor wafers are moved under a certain pressure and as a result semiconductor material is removed, while a suspension containing abrasives is supplied, between an upper and a lower working disk. This is known by the person skilled in the art as a lapping wheel which generally consists of steel and is provided with channels for improved distribution of the suspension. The wafers are kept on a geometric path by carriers which are set in rotation by means of drive rings and have cutouts for receiving the semiconductor wafers.

The purpose of the lapping is to remove damage which has been produced during the sawing of the semiconductor crystal and to produce a predetermined thickness and plane-parallelism of the semiconductor wafers. Typically, from 20 μm to 120 μm of semiconductor material is removed, with this material preferably being divided evenly between the two sides of the semiconductor wafer.

Processes for the double-side grinding of semiconductor wafers are also known and have recently started to replace lapping to a greater extent, on account of cost benefits. In this context, by way of example DE 196 26 396 A1 describes a process which simultaneously machines a plurality of semiconductor wafers and operates with movements of the semiconductor wafer which are similar to those used in double-side lapping. The purpose of the double-side grinding is similar to that of the lapping; the typical amounts of material removed are also similar.

The process of double-side polishing of semiconductor wafers represents a refinement of the lapping process, with planar polishing plates, to which a polishing cloth is attached. They replace the upper and lower lapping wheels as working disks, and with a polishing suspension which generally contains alkali-stabilized colloids being supplied. According to U.S. Pat. No. 5,855,735, at a solids concentration of over 6% by weight there is a transition from the chemical-mechanical double-side polishing to a double-side rough polishing in lapping mode.

Once again, in this case the semiconductor wafers are moved along a fixed path by carriers which are set in rotation, with the upper and lower polishing plates generally rotating in opposite directions. A polishing machine for this purpose is described, for example, in DE 100 07 390 A1. A process for the double-side polishing of semiconductor wafers in order to achieve high degrees of flatness, with the finished polished semiconductor wafers being only 2 to 20 μm thicker than the carriers made from stainless steel, is known from DE 199 05 737 C2. With this process, it is possible to achieve semiconductor wafers with local flatness values, expressed as $SFQR_{max}$ for a grid with component surface areas of 25 mm×25 mm, of less than or equal to 0.13 μm. This is required for semiconductor component processes with line widths of less than or equal to 0.13 μm. A process for remachining by double-side polishing is described in DE 199 56 250 C1. To protect the edge of the semiconductor wafers, according to an embodiment described in EP 208 315 B1, the carriers expediently have plastic-lined cutouts for receiving the semiconductor wafers, a process which is also in widespread use in lapping.

The purposes of the double-side polishing are to establish the final plane-parallelism and flatness of the semiconductor wafer and to eliminate damaged crystal layers and surface roughness resulting from the preceding processes, for example lapping or grinding followed by etching. The high flatness of double-side polished semiconductor wafers, combined with the presence of a polished back surface with a reduced tendency to particle adhesion, has led to the following. This abrasive polishing process is of considerably greater importance than single-side polishing of the front surface in particular for the production of semiconductor wafers with a diameter of 200 mm and above. Typically, from 10 μm to 50 μm of semiconductor material is removed.

In double-side polishing, generally the same amount of material is removed from the front surface and the back surface of the semiconductor wafers. By contrast, WO 00/36637 claims a process for deliberately leaving damaged crystal layers on the back surface of the wafer by removing increased amounts of material from the front surface during double-side polishing. This can be achieved by using an increased rotational speed of the upper polishing plate. According to DE 197 04 546 A1, asymmetric removal of material of this nature can also be achieved by a multistage process involving double-side polishing—coating of the back surface, for example with oxide—further double-side polishing.

To remain competitive as a manufacturer of semiconductor wafers, it is imperative to provide methods and processes which allow manufacturing with the required quality at costs which are as low as possible. An important approach in this context is to increase the yield of semiconductor wafers per machine to the highest possible level. In the case of double-side polishing, this means, for example, producing high removal rates combined with a high service life of the polishing cloths. The same is also true of double-side lapping and grinding processes, but in this case the service life of the polishing cloths is replaced, for the working disks, by the service life of the lapping wheels or of the abrasive bodies.

A drawback of this process according to the prior art is that with double-side lapping, grinding or polishing, it is impossible, while maintaining certain product properties, for example a high flatness and/or the absence of surface scratches, to achieve an increased machine throughput or a shortened cycle time with a fixed amount of material being removed. Attempts to increase the rate at which semiconductor material is removed by increasing the machining pressure have lead to a deterioration in the flatness and/or to the occurrence of surface scratches. This causes the result that the wafers produced in this way cannot be processed further, but rather have to be discarded or remachined at high cost.

U.S. Pat. No. 6,180,423 B1 describes that, in the case of single-side polishing of only one semiconductor wafer, which is held by a support and is moved in rotation about its center by means of a polishing plate which is also rotating, the path curve of the semiconductor wafer relative to the polishing cloth is dependent on the ratio of the rotational speeds of polishing plate m and support n. This document describes that the coverage of the polishing cloth is as uniform as possible as a result of this helical path curve. This is achieved by the lowest common multiple of m and n being as high as possible. A prolonged higher removal rate and an extended service life of the polishing cloth are stated to be the advantages. Even this process does not close the above-mentioned gap in the prior art, since it cannot be applied to material-removal processes which operate on both sides. The rotation of the carrier is superimposed with a translational movement about the center of the machine relative to the polishing plates, so that 4 degrees of freedom have to be provided instead of 2 (i.e. the rotational speeds of the upper and lower plates, and the rotational speeds of the inner and outer drives of the carriers).

SUMMARY OF THE INVENTION

Therefore, it is an object of the invention to develop a process for the material-removing machining of both sides simultaneously of semiconductor wafers, for example by lapping, grinding or polishing, which results in cost benefits as a result of a higher yield of semiconductor wafers of a defined quality per machine.

Therefore, the present invention is directed to a process for material-removing machining, on both sides simultaneously, of semiconductor wafers having a front surface and a back surface, the semiconductor wafers resting in carriers which are set in rotation by means of an annular outer drive ring and an annular inner drive ring and being moved between two oppositely rotating working disks in a manner which is described by means of in each case a first path curve relative to the upper working disk and a second path curve relative to the lower working disk, wherein the first and the second path curves (a) after six loops around the center have the appearance of still being open, and (b) at each point have a radius of curvature which is at least as great as the radius of the inner drive ring.

Expressed in another way, the two path curves, after less than or equal to six loops about the center, are not continuous or are not virtually continuous and do not at any point have a radius of curvature which is less than that of the inner drive ring.

The shape of the path curves of the invention differs from the strictly helical curves of the single-side polishing according to the prior art in that a plurality of movements are superimposed as a result of the driving of the carriers and the driving of the working disks. An essential feature of the invention is that not only is there uniform coverage of both the upper and lower working disks by the path curve of the semiconductor wafer movement relative to the working disk, but also there are no sudden changes of direction. While, for example in the case of double-side polishing, the first requirement ensures uniform removal of material and rapid regeneration of the upper and lower polishing cloths. The second requirement avoids a harsh procedure acting on the semiconductor wafers. This may lead to vibration of the carrier and/or tilting of the semiconductor wafer, with the risk of poor flatness values or even of the semiconductor wafer breaking as a result of it leaving the carrier. These relationships are unexpectedly surprising and were impossible to predict. Similar considerations to those which have been described for double-side polishing also apply to double-side lapping and grinding.

The starting point for the process is a semiconductor wafer which, in a known way, has been separated from a crystal and had its edges rounded, and may also have been subjected to further process steps. Depending on the process and objectives, it may have a sawn, lapped, ground, etched, polished or epitaxially grown surface. If desired, the edge of the semiconductor wafer may be polished.

The end product of the process is a semiconductor wafer which is lapped, ground or polished on both sides, has a high flatness and freedom from scratches and is superior to the semiconductor wafers of the same quality produced in accordance with the prior art in terms of its production costs.

The process according to the invention can be used for double-side machining, for example by lapping, grinding and polishing, of various types of bodies which are in disk form and consist of a material which can be machined by the abovementioned processes. Examples of materials of this type are glasses, for example based on silica, and semiconductors, for example silicon, silicon/germanium and gallium arsenide. Silicon in single-crystal form for further use in the fabrication of electronic components, for example processors and memory components, is particularly preferred in the context of the invention.

The process is particularly suitable for the machining of semiconductor wafers with diameters of greater than or equal to 200 mm and thicknesses of 500 $\mu$m to 1200 $\mu$m. They can be used either directly as starting material for the production of semiconductor components or can be fed to their intended destination after further process steps have been carried out. These further steps include wet-chemical or plasma etching, polishing and/or after the application of layers such as back-surface seals or an epitaxial coating of the front surface, and/or after conditioning by means of a heat treatment. In addition to the production of wafers comprising a homogeneous material, the invention can, of course, also be used for the fabrication of semiconductor substrates which are of multilayer structure, such as SOI (silicon-on-insulator) wafers.

The process is described further with reference to the example of double-side polishing of silicon wafers. The information given on the calculation and defining of the optimized path curves can be transferred without problems by the person skilled in the art to processes with a similar kinematic procedure. Examples include double-side lapping or grinding, if working disks which are equipped with channels or abrasive bodies are used instead of polishing plates covered with polishing cloth and it is the lapping or grinding wheel which is becoming worn instead of the polishing cloth.

In principle, it is possible to subject a number of silicon wafers, which have been sawn for example by an annular-sawing or a wire-sawing process, to the double-side polishing step according to the invention directly. However, it is preferable for the sharp and therefore mechanically highly sensitive wafer edges to be rounded with the aid of a suitably profiled grinding wheel. Furthermore, to improve the geometry and partially remove the destroyed crystal layers, it is preferable for the silicon wafers to be subjected to material-removing steps such as lapping and/or grinding and/or etching, with all the abovementioned steps being carried out in accordance with the prior art.

A commercially available machine for double-side polishing of a suitable size which allows the simultaneous polishing of at least three silicon wafers using at least three carriers can be used to carry out the polishing step according to the invention. It is particularly preferable to simultaneously use from three to five carriers which are occupied by in each case three silicon wafers which are arranged at regular intervals on a circular path. However, it is also possible for each carrier to be occupied by in each case only one silicon wafer which, however, in order for it to be possible to implement the invention, should be arranged eccentrically in the carrier.

The polishing machine substantially comprises a lower polishing plate, which can rotate freely in the horizontal plane, and an upper polishing plate, which can rotate freely in the horizontal plane. Both of these plates are covered with a polishing cloth, preferably by adhesive bonding. The machine allows double-side abrasive polishing when a polishing abrasive of a suitable chemical composition is supplied continuously. The carriers, which preferably consist of stainless chromium steel, have suitably dimensioned, plastic-lined cutouts for receiving the silicon wafers. The carriers are in contact, for example by means of pin gearing or involute toothing, with the polishing machine via a rotating inner pinned or toothed ring and an oppositely rotating outer pinned or toothed ring. In this way they are set in rotational motion between the two polishing plates which are rotating in opposite directions. The pin gearing is particularly preferred, on account of the smoother running of the carriers and the ease of exchanging the pins.

The carriers for the polishing process according to the invention have a preferred thickness of 500 to 1200 $\mu$m, depending on the final thickness of the polished silicon wafers, which is ultimately dependent on the diameter of the silicon wafers and on the intended use. With a view to production of highly planar silicon wafers, it is preferable for the final thickness of the polished wafers to be 2 to 20 $\mu$m greater than the carrier thickness, with the range from 3 to 10 $\mu$m being particularly preferred. The amount of silicon removed by the double-side polishing is preferably 2 to 70 $\mu$m, particularly preferably 5 to 50 $\mu$m.

To describe the invention, there are figures which illustrate the invention. Parameters which are marked in the drawings are printed in bold in the following considerations relating to the path curves. All the data refers to the polishing of silicon wafers with a diameter of 300 mm on a commercially available double-side polishing machine of type AC2000 produced by Peter Wolters, Rendsburg (Germany). This polishing machine is equipped with pin toothing of the outer and inner rings for the purpose of driving the carriers. The relationships on which the invention is based can be transferred in a similar way to smaller or larger polishing machines and to lapping and grinding machines and material-removing machines which operate with similar kinematics and to the machining of smaller or larger semiconductor wafers. The figures therefore in no way limit the invention.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
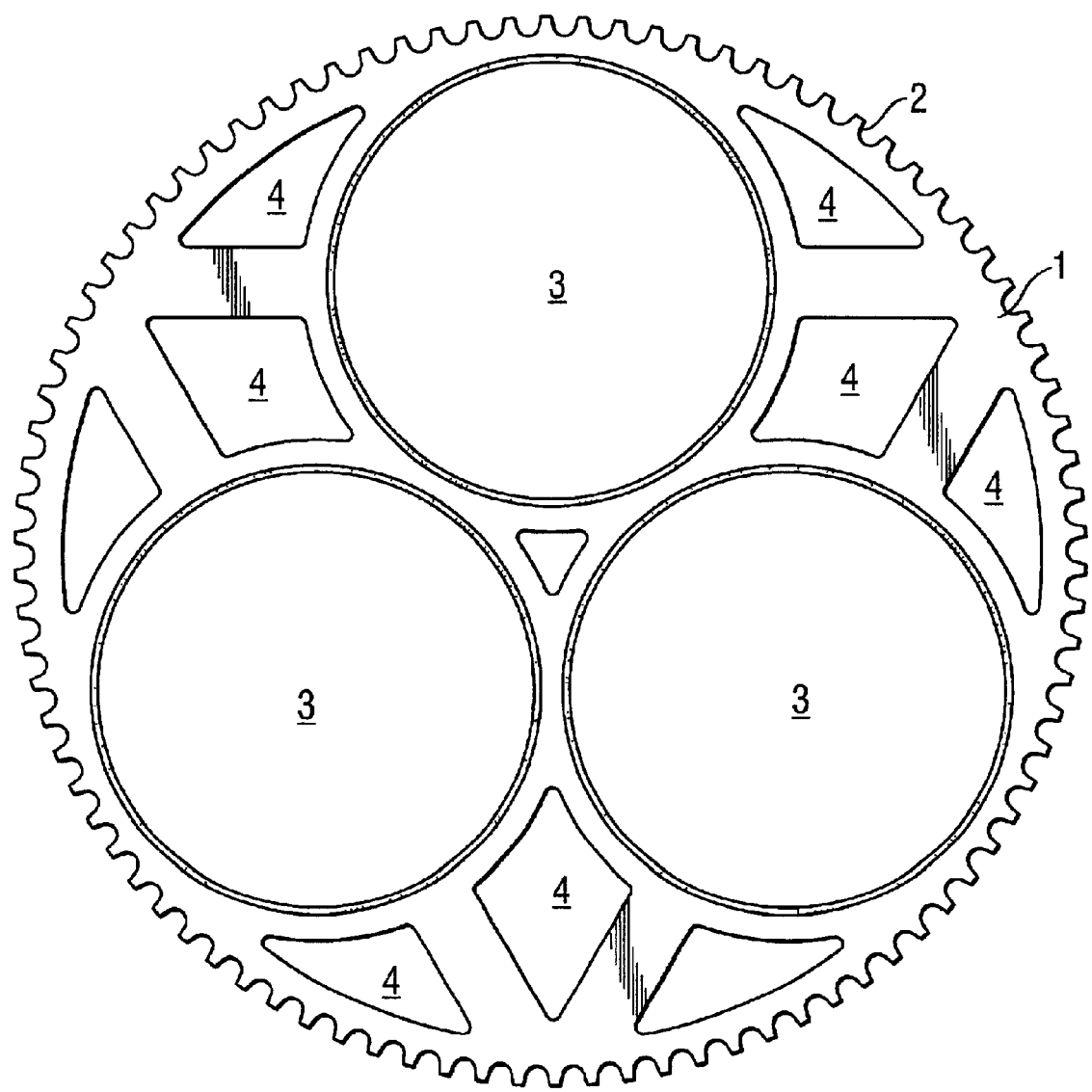
FIG. 1 shows a carrier with a diameter of 720 mm for holding three 300-mm silicon wafers for double-side polishing.

The carrier for double-side polishing 1, which is illustrated in FIG. 1, is characterized by external toothing 2, which can engage with the pins of the outer and inner pinned rings of the polishing machine. It also has plastic-lined openings 3 for receiving the silicon wafers which are to be polished, and additional openings 4, which ensure improved distribution of the polishing abrasive between the two polishing cloths.

Figure 2:
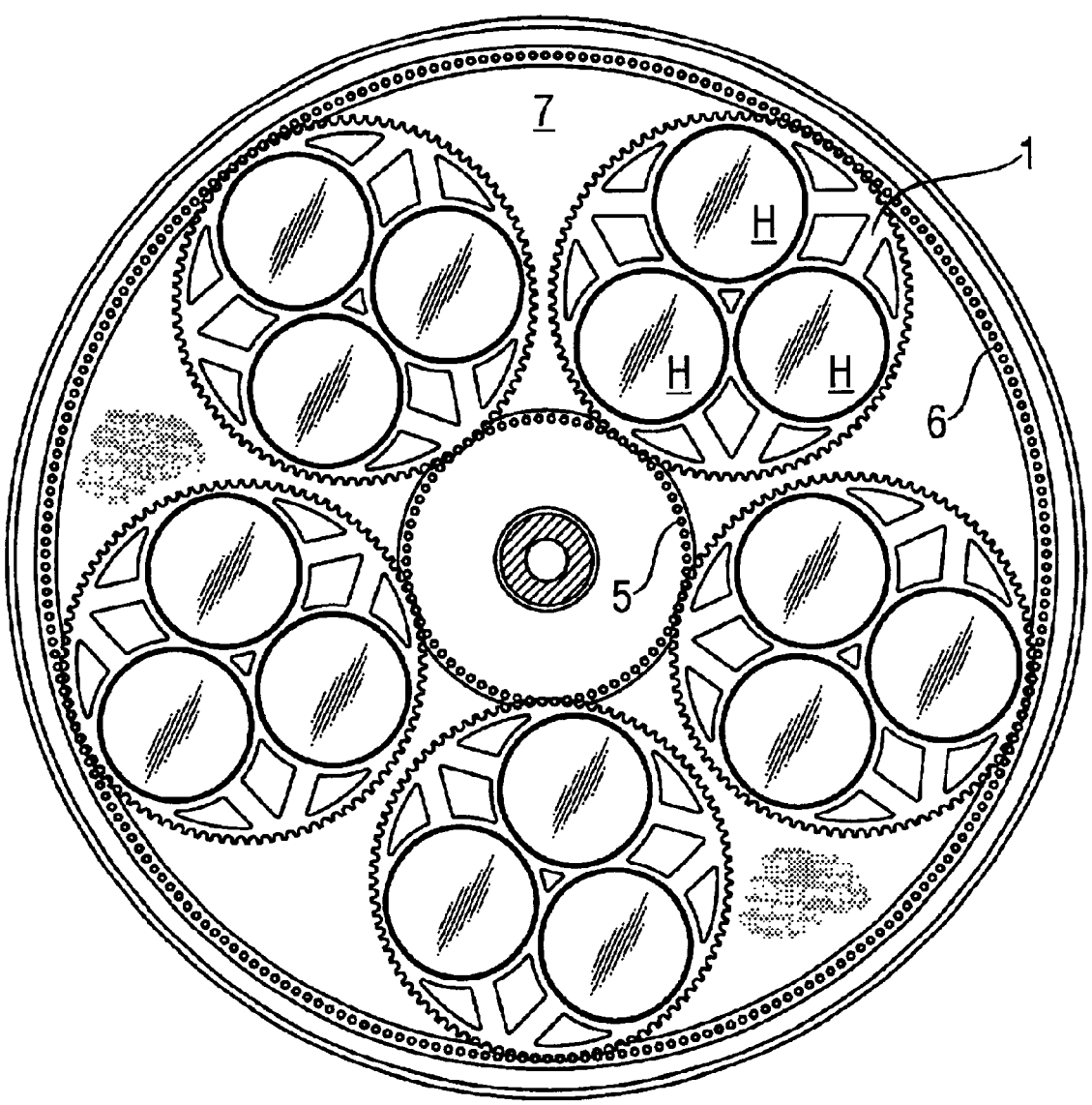
FIG. 2 shows the arrangement of a plurality of the carriers illustrated in FIG. 1 in a double-side polishing machine, the diameter of the outer pinned ring being 1970 mm and the diameter of the inner pinned ring being 530 mm.

FIG. 2 shows the typical maximum occupancy of a polishing machine of type AC2000 with carriers 1 which are occupied by in each case three semiconductor wafers H, in this case silicon wafers, with a diameter of 300 mm. A similar geometric arrangement also results, for example, if a polishing machine of the smaller type AC1500, likewise produced by Peter Wolters, is occupied by 200-mm semiconductor wafers. The carriers 1 are set in rotation by an inner pinned ring 5 and an outer pinned ring 6, the directions of rotation of 5 and 6 preferably having different signs. The semiconductor wafers H are in contact with the polishing cloth of a rotating upper polishing plate and of a lower polishing plate 7, which preferably rotates in the opposite direction, the polishing plates being congruent when viewed from above.

Figure 3:
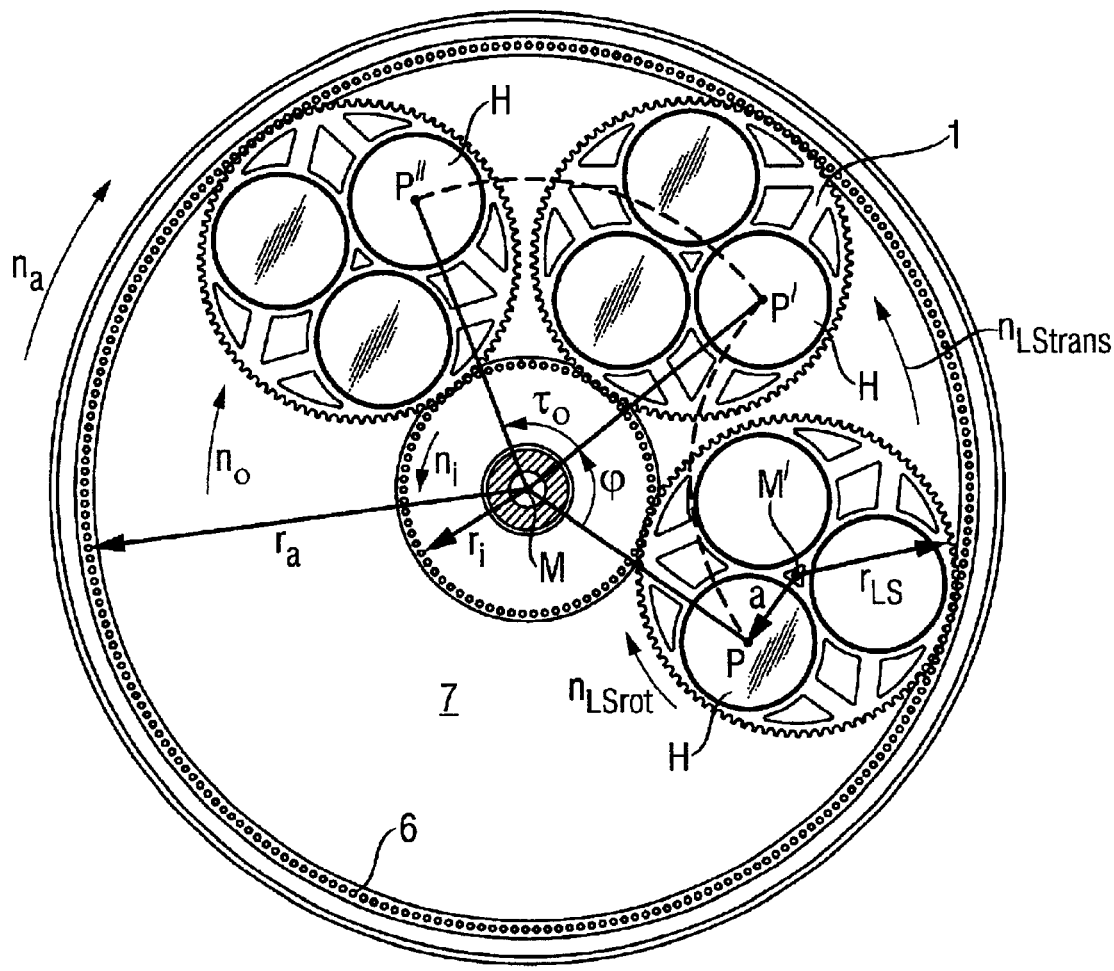
FIG. 3 shows the geometric relationships which are of relevance with simultaneous rotation of upper and lower polishing plates and inner and outer pinned rings for the movement of a silicon wafer relative to the polishing cloth, in a double-side polishing machine as shown in FIG. 2.

FIG. 3 gives information which is important for deriving the geometric relationships during double-side polishing. The pinned rings 5 and 6 and the two polishing plates 7 are rotating about the fixed center axis of the polishing machine M, while the carriers 1 are rotating about their own center M', which does not have to be stationary. The following rotation characteristic variables (given by way of example in RPM=Revolutions Per Minute) are of importance in this context:

$n_o$=rotational speed of upper polishing plate 7 about M
$n_u$=rotational speed of lower polishing plate 7 about M
$n_a$=rotational speed of outer pinned ring 6 about M
$n_i$=rotational speed of inner pinned ring 5 about M
$n_{LSrot}$=rotational speed of carrier 1 about M'
$n_{LStrans}$=rotational speed of carrier 1 about M $n_0$ and $n_u$, as well as two of the four variables $n_a$, $n_i$, $n_{LSrot}$ and $n_{LStrans}$ can be selected as desired by the machine operator. This results from the geometric relationships $$n_a = (r_{LS}/r_a) \times n_{LSrot} + n_{LStrans} \quad (1)$$

and $$n_i = (r_{LS}/r_i) \times n_{LSrot} + n_{LStrans} \quad (2)$$

or, after transforming (1) and (2)

$$\boxed{n_{LSrot} = (n_a - n_i)/(r_{LS}/r_a + r_{LS}/r_i)} \quad (3)$$

and $$\boxed{n_{LStrans} = (r_a \times n_a + r_i \times n_i)/(r_a + r_i)} \quad (4)$$

where $r_{LS}$=radius of the carrier 1
$r_a$=radius of the outer pinned ring 6
$r_1$=radius of the inner pinned ring 5.
For a machine of type AC2000, $$(3) \text{ becomes } n_{LSrot} = 0.5801 \times (n_a - n_i) \quad (5)$$

$$\text{and (4) becomes } n_{LStrans} = 0.7880 \times n_a + 0.2120 \times n_i \quad (6).$$

The path curve of a point P at a distance a from the center M' of the carrier 1 relative to the upper polishing cloth 7 will now be considered. This point P may be the center of the semiconductor wafers H, if they are all arranged at the same distance around point M'. P is preferably a point on a circle around M' which is most densely occupied with semiconductor material, in order to take account of the load on the polishing cloth. In the described situation in which carriers 1 are used on a polishing machine AC2000, the radius of this circle a was assumed to be 200 mm.

As a result of the carrier 1 rotating along the outer pinned ring 6, the real point P would initially move to the imaginary point P', which is at an angle φ with respect to M for P. This movement can be regarded as a hypocycloidal path and can be described in a Cartesian coordinate system by the formula known to the person skilled in the art $$x = (r_a - r_{LS}) \times \cos\phi + a \times \cos[\phi \times (r_a - r_{LS})/r_{LS}] \quad (7)$$

and $$y = (r_a - r_{LS}) \times \sin\phi - a \times \sin[\phi \times (r_a - r_{LS})/r_{LS}] \quad (8)$$

(Because $r_a - r_{LS} = r_i + r_{LS}$, in the selected case the equations can also be used to describe an epicycloidal path, with the carrier rolling around the inner pinned ring.)

While point P is moving to point P' through a section φ of the hypocycloidal path, by way of example the upper polishing plate is rotating in the opposite direction through the angle $-\tau_o$, which leads to the point P' rotating about M through the angle $\tau_o$ (="translational movement" of M' on an orbit about M) and therefore to the point P". For it to be possible to calculate the position of the point P" relative to the starting point P based on the upper polishing plate after a unit time t, it is necessary first of all to establish a relationship between the times required to cover the angles φ and $\tau_o$. For this purpose, the outer drive ring is used as an imaginary reference circle which should not move:

$$n_a' = n_a - n_a = 0$$

$$\rightarrow n_o' = n_o - n_a \quad (9)$$

$$n_o' = n_i - n_a \quad (10)$$

$$n_{LStrans}' = n_{LStrans} - n_a \quad (11)$$

$$n_{LSrot}' = n_{LSrot} \quad (12)$$

In this case, $$\tau_o = -n_o' \times t \quad (13)$$

(or $\tau_u = -n_u' \times t$; negative signs on account of the different directions of rotation of $n_o$ or $n_u$ and $\tau_o$ or $\tau_u$)
and $$\phi = n_{LStrans}' \times t \quad (14)$$

On the basis of (9), it follows that $$\tau_0 = (n_a - n_o) \times t \quad (15)$$

Introducing (11) and (14) into (1) results in $$\phi = -(r_{LS}/r_a) \times n_{LSrot} \times t \quad (16)$$

Equating (15) and (16) over t results in $$\tau_o = (n_o - n_a) \times \phi r_a/(n_{LSrot} \times r_{LS}) \quad (17).$$

Therefore, while the angle φ is being covered by point P on the basis of the hypocycloidal movement (equations (7) and (8)) about M, at the same time a rotational movement $\tau_o$ relative to the upper polishing plate is taking place, and according to equation (17) this rotational movement can be described as a function of φ. Superimposing the two movements can be achieved by rotating the system of coordinates x-y, which describe the hypocycloidal movement, through $-\tau_0$ into a system of coordinates x'-y':

$$x' = x \times \cos(-\tau_o) + y \times \sin(-\tau_o) \quad (18)$$

$$y' = -x \times \sin(-\tau_o) + y \times \cos(-\tau_o) \quad (19)$$

The overall movement P→P" can now be described by introducing (7), (8) and (17) into (18) and (19):

$$x' = x \times \cos(-\tau_o) + y \times \sin(-\tau_o) \quad (18)$$

$$x' = \{(r_a - r_{LS}) \times \cos\phi + a \times \cos[\phi \times (r_a - r_{LS})/r_{LS}]\} \times \cos(-\tau_o) + \{(r_a - r_{LS}) \times \sin\phi - a \times \sin[\phi \times (r_a - r_{LS})]\} \times \sin(-\tau_o)$$

$$x' = \{(r_a - r_{LS}) \times \cos\varphi + a \times \cos[\varphi \times (r_a - r_{LS})/r_{LS}]\} \times \cos[-(n_o - n_a) \times \varphi \times r_a/(n_{LSrot} \times r_{LS})] - \{(r_a - r_{LS}) \times \sin\varphi - a \times \sin[\varphi \times (r_a - r_{LS})/r_{LS}]\} \times \sin[-(n_o - n_a) \times \varphi \times r_a/(n_{LSrot} \times r_{LS})]$$ (20)

$$y' = -x \times \sin(-\tau_o) + y \times \cos(-\tau_o)$$ (19)

$$\rightarrow y' = \{-(r_a r_{LS}) \times \cos\varphi - a \times \cos[\varphi \times (r_a - r_{LS})/r_{LS}]\} \times \sin(-\tau_o) + \{(r_a - r_{LS}) \times \sin\varphi - a \times \sin[\varphi \times (r_a - r_{LS})/r_{LS}]\} \times \cos(-\tau_o)$$

$$y' = \{-(r_a - r_{LS}) \times \cos\varphi - a \times \cos[\varphi \times (r_a - r_{LS})/r_{LS}]\} \times \sin[-(n_o - n_a) \times \varphi \times r_s/(n_{LSrot} \times r_{LS})] + [(r_a - r_{LS}) \times \sin\varphi - a \times \sin[\varphi \times (r_a - r_{LS})/r_{LS}]\} \times \cos[-(n_o - n_a) \times \varphi \times r_a/(n_{LSrot} \times r_{LS})]$$ (21)

where (x', y') corresponds to the coordinates of point P" after passing through the angle $\phi$ through the hypocycloidal path. For $\phi=0$, the result is $x'=r_a-r_{LS}+a$ and $y'=0$.

The mean velocity $v_o$ ($v_u$) of the point P relative to the upper (or lower) polishing plate can be calculated from the distance covered by point (x', y')

$$s = \Sigma[(x_j' - x_1')^2 + (y_j' - y_1')^2]^{1/2}$$ (22)

and equation (16), resolved according to time t, $$t = -\phi \times r_a/(r_{LS} \times n_{LSrot})$$ (16)

to be v=s/t (or $v_o=s_c/t$ and $v_j=s_j/t$)

$$v = -(r_{LS} \times n_{LSrot})/(\varphi \times r_a) \times \sum[(x_3' - x_i')^2 + (y_3' - y_i')^2]^{1/2}$$ (23)

if the distance s is added from the sum of the distances ($x_j$, $y_j$) and ($x_1$, $y_1$) for angles >360°, small angular increments $\Delta\phi$, for example at intervals of 1°, using equations (20) and (21). It is also possible to calculate changes in velocity.

With the aid of the calculation formulae (20), (21) and (23) listed, it is possible to calculate path curves and velocities using a commercially available table calculation program on any sufficiently powerful PC.

In theory, any desired combinations can be selected for the rotational speeds $n_o$, $n_u$, $n_a$ and $n_i$ and the resulting mean relative velocities $V_c$ and $V_u$ and the polishing pressure P. However, in practice the possibilities are limited, primarily by the machine design, the load on the material and safety aspects. It is preferable to use a different direction of rotation for the upper and lower plates and the outer and inner drive rings, as expressed by the signs. For simultaneous polishing of 15 silicon wafers with a diameter of 300 mm on a polishing machine AC2000, the following particularly preferred parameter ranges are appropriate and manageable in production and form the subject of the extensive tests which led to the invention:

$n_o$=+10 . . . +25 U/min
$n_u$=−10 . . . −26 U/min
$v_c$=−0.5 . . . −2.0 m/sec
$v_u$=+0.5 . . . +2.0 m/sec
$n_a$=+3 . . . +10 U/min
$n_i$=−10 . . . −26 U/min
P=0.10 . . . 0.25 bar Under these conditions, the rates at which silicon was removed were between 0.4 and 2.0 µm/min. Within the context of the invention, material-removal rates of between 0.65 and 1.8 µm/min are preferred, in order to ensure sufficiently high machine throughputs; material-removal rates of between 0.8 and 1.5 µm/min are particularly preferred.

A theoretical approach aimed at gaining an understanding of polishing, which in theory can be applied equally well to any other material-removing process, states that the rate at which material is removed should be proportional to the polishing pressure P and to the silicon wafer/polishing cloth relative velocity v (Preston equation). Accordingly, it should be possible to increase the material-removal rate under constant rotational conditions by increasing the pressure or to achieve the same polishing result using the same relative velocity but a different combination of rotation parameters.

Particularly in the case of double-side processes, for example double-side polishing, this equation can only be applied to a limited extent. This is because increasing the material-removal rate by raising P and/or $v_o/v_u$ is often associated with a deterioration in the flatness, expressed for example as $SFQR_{max}$ or an increase in the scratch rate, for example as a result of deposits of material on the polishing cloths. Therefore, optimum combinations of path curves and pressures have been sought within the context of the invention.

Figure 4A:
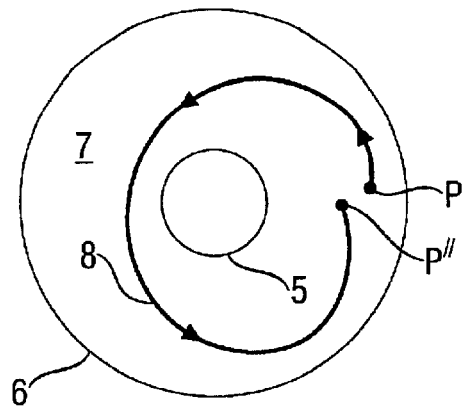
FIGS. 4*a–f* shows the path curve of a silicon wafer during the double-side polishing on the polishing machine shown in FIG. 2 relative to the upper polishing cloth (a,c,e) and lower polishing cloth (b,d,f) after a run time of 6 sec (a,b), 20 sec (c,d) and 120 sec (e,f), for the rotation parameters set in Comparative Example 1, in a Cartesian coordinate system; and as is generally customary, the x axis is plotted horizontally and the y axis is plotted vertically, and the points (x, y) in the top right-hand quadrant have positive signs.
Figure 4B:
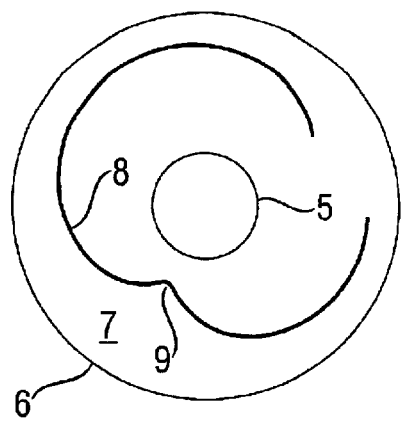
Figure 4C:
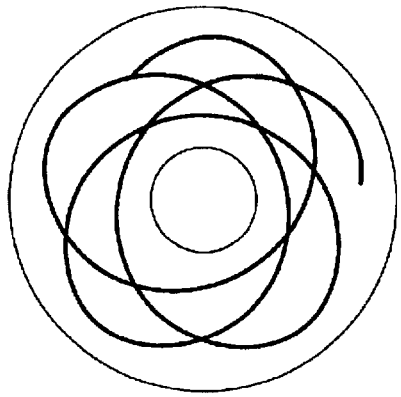
Figure 4D:
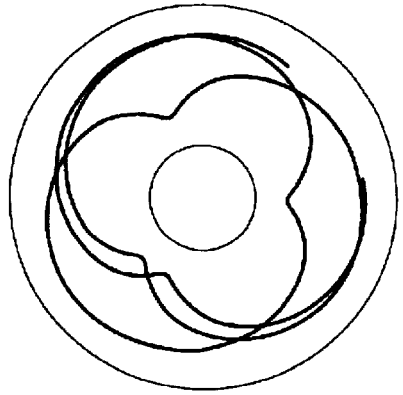
Figure 4E:
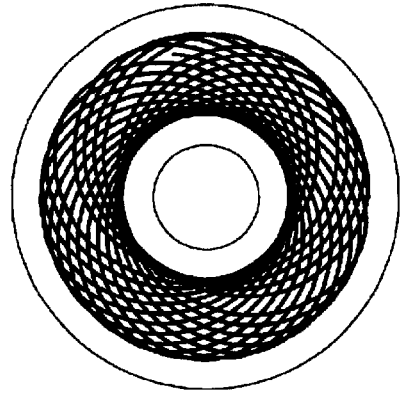
Figure 4F:
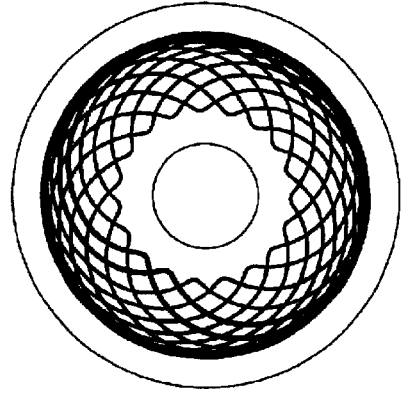
Figure 5A:
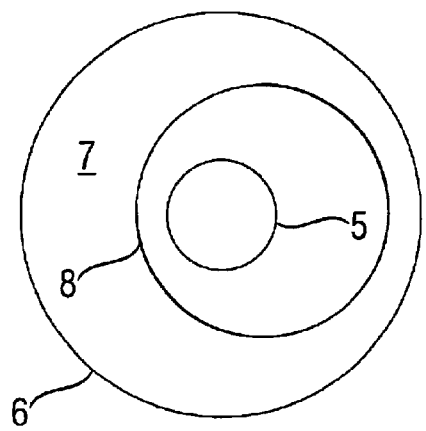
FIGS. 5*a–f* corresponds to FIGS. 4*a–f* for Comparative Example 2.
Figure 5B:
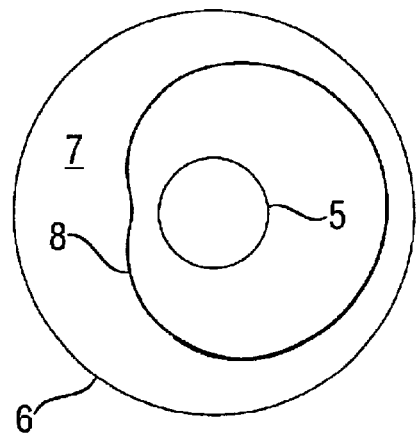
Figure 5C:
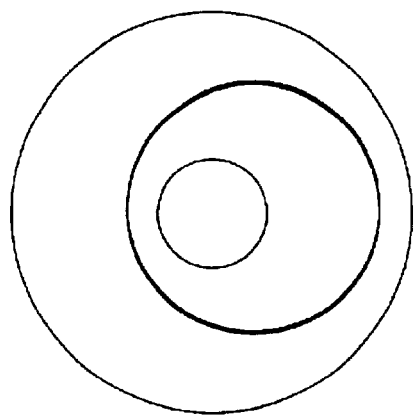
Figure 5D:
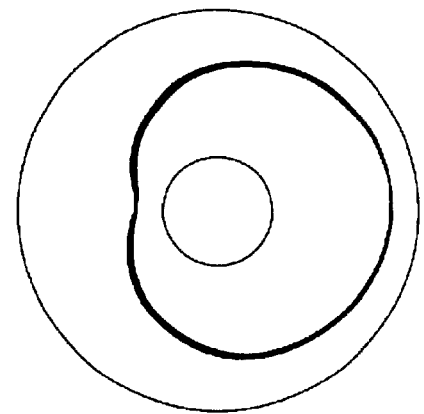
Figure 5E:
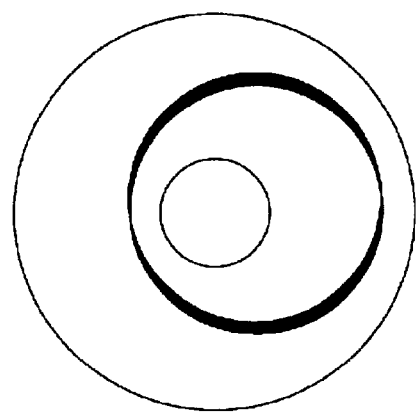
Figure 5F:
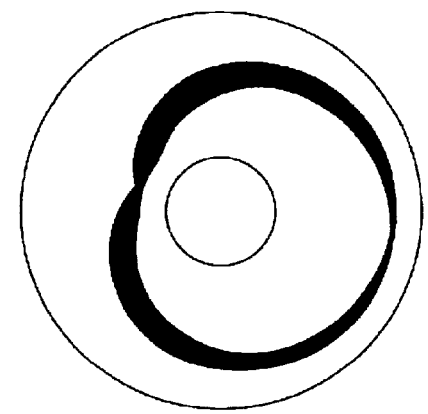
Figure 6A:
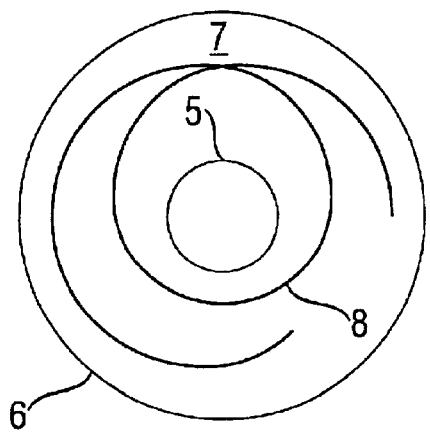
FIGS. 6*a–f* corresponds to FIGS. 4*a–f* for Comparative Example 3.
Figure 6B:
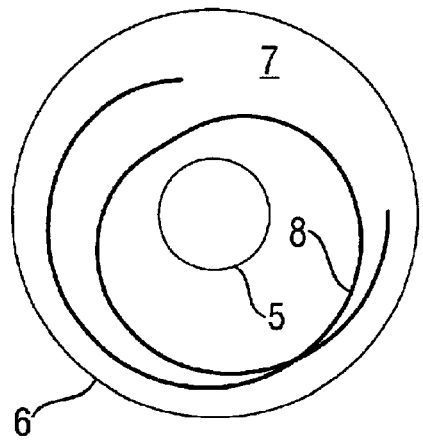
Figure 6C:
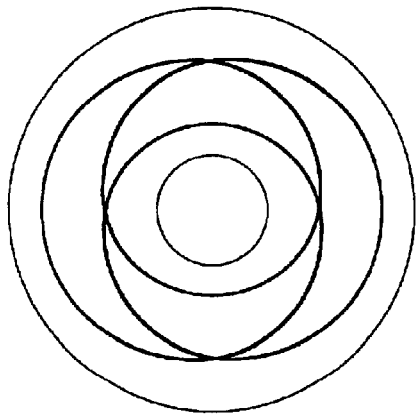
Figure 6D:
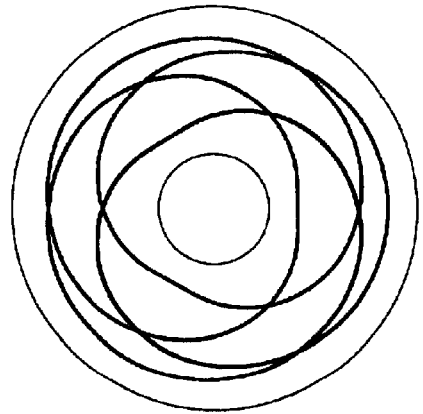
Figure 6E:
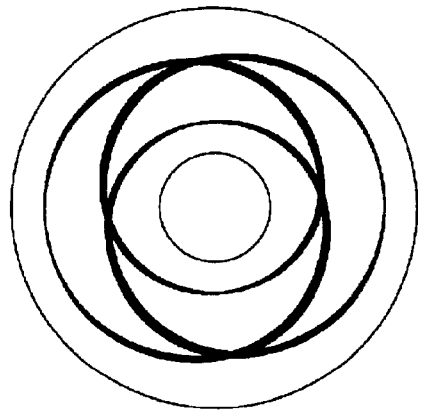
Figure 6F:
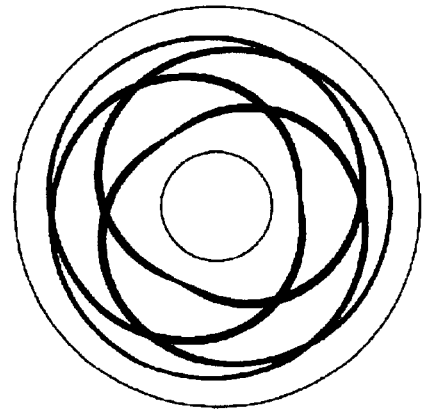
Figure 7A:
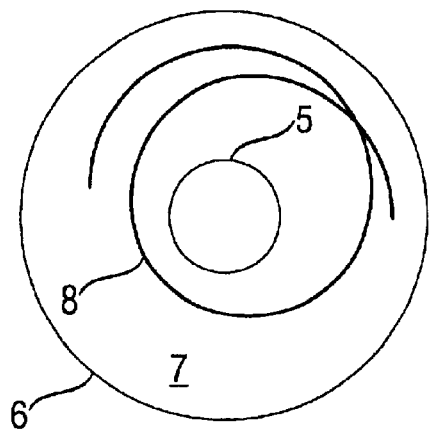
FIGS. 7*a–f* corresponds to FIGS. 4*a–f* for Example 1.
Figure 7B:
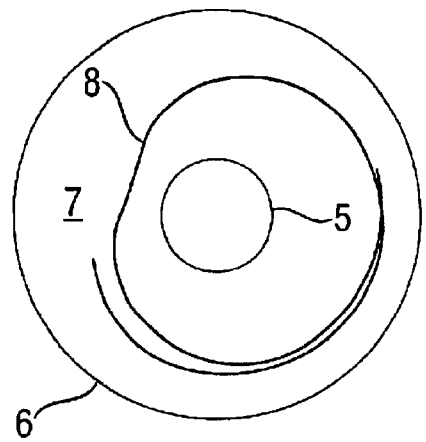
Figure 7C:
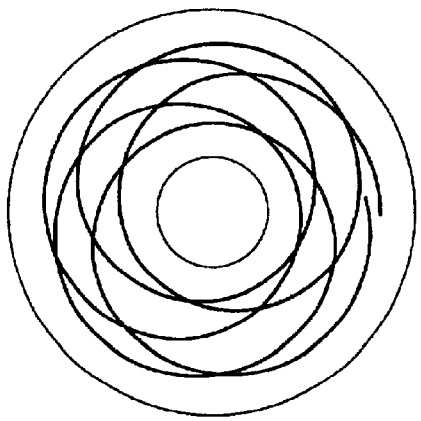
Figure 7D:
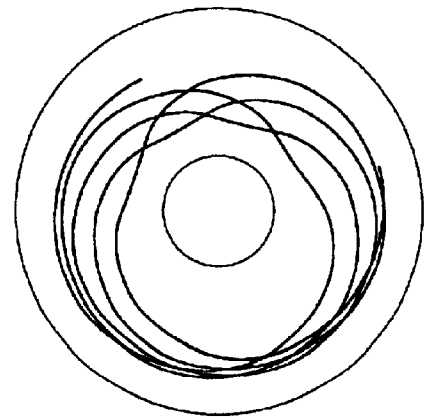
Figure 7E:
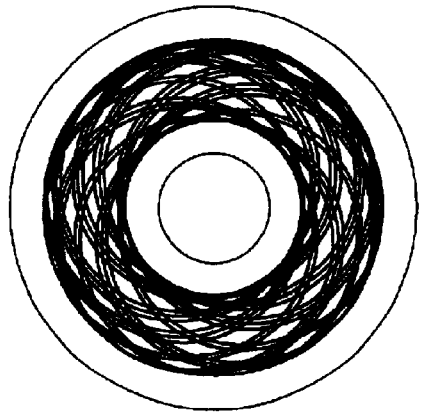
Figure 7F:
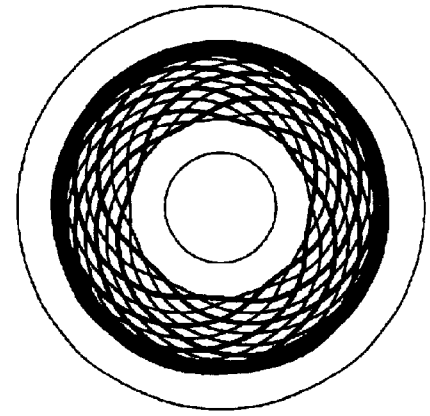
Figure 8A:
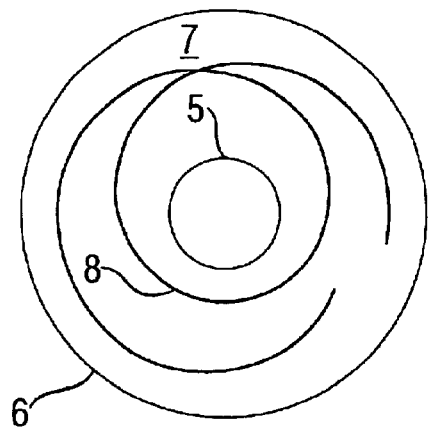
FIGS. 8*a–f* corresponds to FIGS. 4*a–f* for Example 2.
Figure 8B:
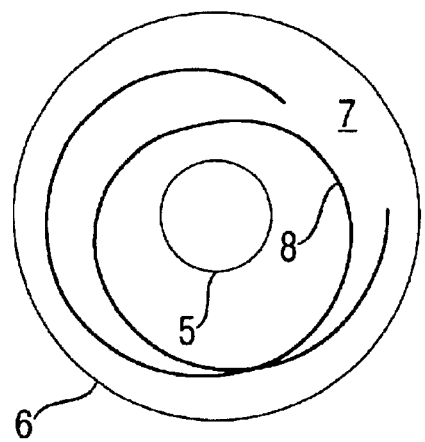
Figure 8C:
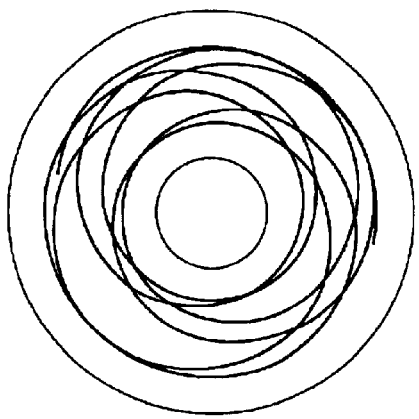
Figure 8D:
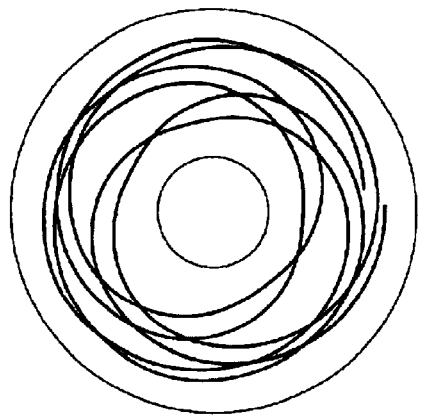
Figure 8E:
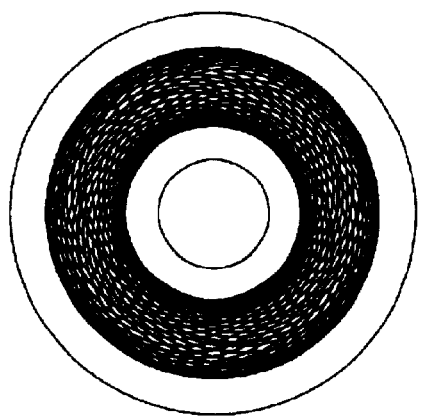
Figure 8F:
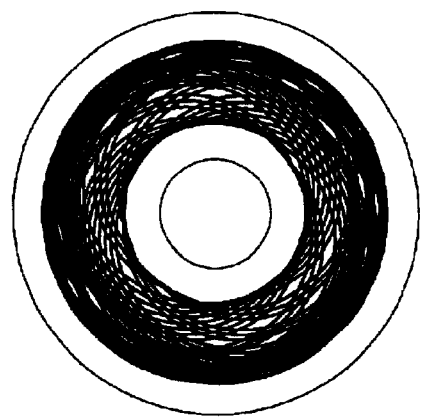
Figure 9A:
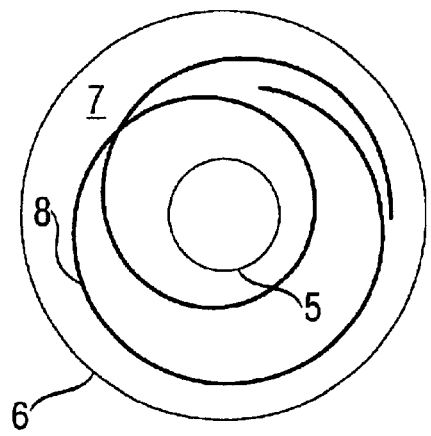
FIGS. 9*a–f* corresponds to FIGS. 4*a–f* for Example 3.
Figure 9B:
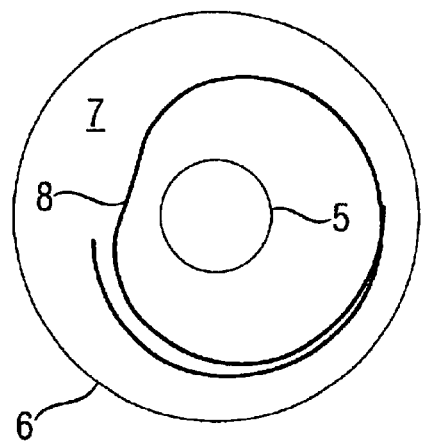
Figure 9C:
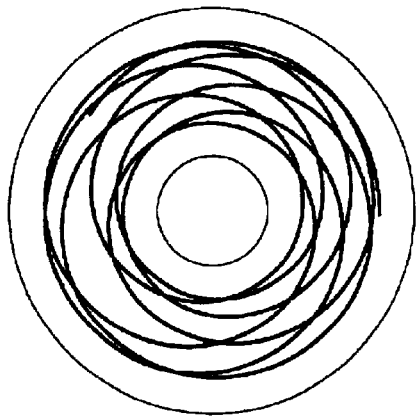
Figure 9D:
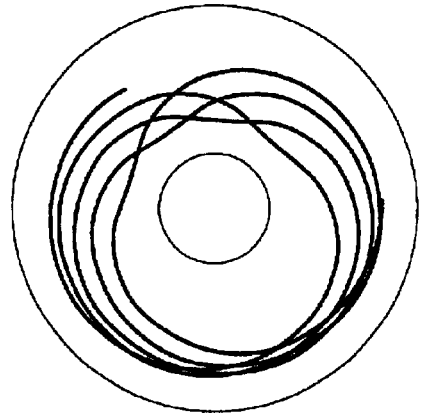
Figure 9E:
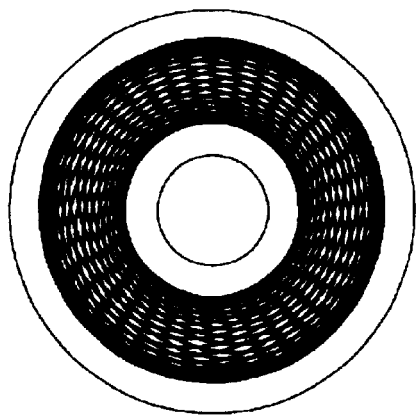
Figure 9F:
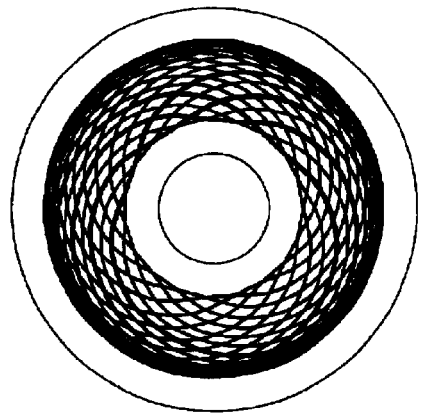

By applying equations (20), (21) and (23), it has been found that, by using various combinations of the parameters $n_o$, $n_u$, $n_a$ and $n_i$ it is possible to produce a very wide range of path curves of the point P relative to the upper or lower polishing cloth and various relative velocities. A number of examples are shown in FIGS. 4a to 9f. In principle, it is possible to draw a distinction between what are known as open path curves (FIGS. 4a–f and 7a to 9f) and path curves which are closed after only a few loops (FIGS. 5a–f and 6a–f). The open path curves can in turn be divided into curves with relatively weakly pronounced curvature (FIGS. 7a to 9f) and strong curvature (FIGS. 4b, d, f).

Closed path curves appear periodically when the rotational speeds are varied within the stipulated ranges. For example, for $n_a$=5.4 rpm and $n_i$=−16 rpm, they are found in the region of the following plate rotational speeds:

| | |
|---|---|
| double loop: | $n_o$ = 25.69 rpm and $n_u$ = −23.96 rpm |
| 3rd loop: | $n_o$ = 19.48 rpm and $n_u$ = −17.75 rpm |
| 4th loop: | $n_o$ = 17.41 rpm and $n_u$ = −15.59 rpm |
| 5th loop: | $n_o$ = 16.38 rpm and $n_u$ = −14.65 rpm |
| 6th loop: | $n_o$ = 15.76 rpm and $n_u$ = −14.03 rpm |
| single loop: | $n_o$ = 13.28 rpm and $n_u$ = −11.55 rpm |
| 3rd rosette: | $n_o$ = 10.17 rpm |

Single loops are shown in FIGS. 5a–f, while 3rd and 4th loops are shown in FIGS. 6a–f.

The movement of the silicon wafers relative to the upper and lower polishing cloths, expressed by the movement of the point P→P", on closed path curves leads to uneven loading on the polishing cloth. Firstly, the cloth on these paths does not relax sufficiently after the compression during the polishing operation before it passes over the next silicon wafer, which is to the detriment of the flatness of the wafer which can be achieved. Secondly, silicon or its reaction products which is/are removed by polishing is deposited preferentially on the paths which are subject to the highest loading, which the person skilled in the art recognizes from falling material-removal rates and in some cases from the formation of brown strips on the polishing cloth, leading to scratched surfaces of the silicon wafers. These effects come to bear in particular when the polishing pressure is increased from, for example, a range of 0.10 to 0.15 bar to a range of 0.18 to 0.25 bar, in order to achieve higher material-removal rates.

Within the tests on which the invention is based, we have established that the polishing pressure can be increased without significant adverse effects on the geometry and polishing scratches if closed path curves, such as those illustrated in FIGS. 5a to 6f, or virtually closed path curves in which the number of loops is less than or equal to six are avoided. This is achieved, for example if the ring rotational speeds are $n_a$=5.4 rpm and $n_i$=−16 rpm, the range of the rotational speeds $n_o$ and $n_u$ for the upper and lower polishing plates which are listed above (i.e. ±0.1 to ±0.25 rpm) are avoided. For modified combinations for the ring rotational speeds $n_a$ and $n_i$ the critical values shift, although the same path figures should generally be reckoned with.

This requirement that critical path curves be avoided is satisfied in the path curves illustrated in FIGS. 7a to 9f.

Closed or virtually closed path curves with loop numbers of greater than six de facto mean a uniform load on the polishing cloths and are not critical within the context of the invention.

A second condition which is of relevance to the invention relates to the radii of curvature which occur over the course of a path curve 8. We have discovered that sudden changes in direction of the path curve, in combination with the deceleration of the relative movement which takes place at this point, are disadvantageous in particular with a view to achieving sufficiently high flatness of the silicon wafer, in particular if the abovementioned increase in the polishing pressure from, for example, a range of 0.10 to 0.15 bar to a range of 0.18 to 0.25 bar is carried out. With procedures which are at the upper limit of the pressure range, silicon wafers may be pulled out of the carriers through tilting, which inevitably leads to fractures, and generally it is not only the silicon wafers and polishing cloths, but also the set of carriers, which are destroyed. An example of a procedure of this type is shown in FIG. 4b, point 9. Critical radii of curvature of the path curves 8 of this nature may occur at relatively low polishing-plate rotational speeds (<10 . . . 12 rpm) and at carrier rotational speeds which are relatively high in relation to the plate rotational speeds.

Therefore, to increase the material-removal rate in double-side polishing without having to accept losses of quality, it is not only closed path curves but also radii of curvature of the path curves which are lower than the radius of curvature of the inner drive ring 5 which are to be avoided. It will be clear that these two conditions must apply simultaneously for the path curve relative to the upper and lower polishing plates. Within the context of the invention, it is possible, by applying equations (20) and (21), to make an accurate prediction of which path curves satisfy both the abovementioned conditions. It has been found that only a certain selection of the wide range of possible combinations of $n_o$, $n_u$, $n_a$ and $n_i$, which forms the subject matter of the invention, has proven successful in practical operation, for the reasons which have been described above.

With these conditions, which characterize the invention, it is possible to successfully carry out double-side polishing of silicon wafers at path velocities v-oor $v_j$ of ±1.0 to ±1.8 m/sec and pressures of 0.18 to 0.25 bar, with typical material-removal rates of 0.8 and 1.5 μm/min. In methods according to the prior art, with the same basic conditions, according to DE 199 05 737 C2 it is possible, for example at a pressure of 0.15 bar, to achieve a material-removal rate of 0.55 μm/min.

The invention can be used if the same amount of material is removed from the front surface and the back surface of the silicon wafers. This is achieved with a certain accuracy if $v_o$ and $v_j$ are selected to be approximately equal. However, by suitably selecting $v_o$ and $v_u$, it is also possible for more material to be removed from one surface, for example from the front surface, in order, while overall removing as little material as possible, to ensure that damaged crystal layers and other surface defects are removed from the front surface. Of course, the optimized path curves can also be used to deploy brush disks for cloth cleaning or substrate disks covered by abrasive bodies for cloth conditioning if it is desired to carry out these steps in order to ensure uniform machining of the upper and lower polishing cloths.

Within the scope of the statements which have been made with regard to the rotation and pressure conditions, the double-side polishing step is carried out in a manner which is known to the person skilled in the art.

Polishing is preferably carried out using a commercially available polyurethane polishing cloth with a hardness of 50 to 100 (Shore A) which may have incorporated reinforcing polyester fibers. When polishing silicon wafers, it is recommended for a polishing abrasive with a pH of preferably 9.5 to 12.5 comprising preferably 1 to 5% by weight of $SiO_2$ in water to be supplied continuously. The percent by weight of $SiO_2$ is based upon the total abrasive weight.

To end the polishing step, the chemically highly reactive, hydrophobic wafer surface has to be passivated. Within the context of the invention, this is preferably carried out by supplying a liquid or a plurality of liquids in succession, containing one or more film-forming agents, with the result that the polished front surface, back surface and edge of the silicon wafers are completely wetted with a film of liquid. A concentration range between 0.01 and 10% by volume of film-forming substance in the stopping agent is generally appropriate. It is particularly preferable to use one or more substances selected from a group or compounds consisting of monohydric or polyhydric alcohols, polyalcohols and surfactants and which can be removed during subsequent cleaning. An embodiment of the stopping operation which implements the same principle and is likewise particularly preferred is to supply an aqueous polishing abrasive which is based on $SiO_2$ and contains one or more substances from the abovementioned groups of compounds, in amounts of from 0.01 to 10% by volume.

After the supply of stopping agent and, if appropriate, ultrapure water has ended, the silicon wafers are removed from the polishing machine and are cleaned and dried in accordance with the prior art. The silicon wafers are then assessed with regard to quality features which are influenced by the polishing step and are specified by the further user of the wafers, using methods which are known to the person skilled in the art. Features of this type may, for example, be local geometry data, which can be determined on a commercially available measuring instrument which operates on a capacitive or optical principle. Further quality features which are assessed may be properties relating to the front surface, the back surface and/or the edge of the wafers. The visual assessment of the occurrence and extent of scratches, spots and other deviations from the ideal silicon surface under strongly focused light is of considerable importance in this context. Furthermore, by way of example tests of roughness, topology and for metal contamination on commercially available measuring units may be sensible or required.

With regard to these parameters which are used for wafer characterization, the silicon wafers which are produced in accordance with the invention do not have any drawbacks compared to silicon wafers which have been produced in accordance with the prior art. They are suitable for the fabrication of semiconductor components with line widths of less than or equal to 0.13 μm; in particular, very high local flatness, expressed for example as $SFQR_{max}$ less than or equal to 0.13 μm, is achieved in combination with scratch-free surfaces. By using the possibility of increasing the yield of the installations, in accordance with the invention by optimizing the path curves, with an associated increase in the material-removal rates for material-removing machining of both sides simultaneously of the semiconductor wafers, the wafers can at least be produced at a cost which is 40% lower per process step which removes material from both sides and up to 15% lower with regard to the overall process sequence, compared to processes in accordance with the prior art, which represents a significant competitive advantage.

Depending on their further destination, it may be necessary for the wafer front surface to be subjected to surface polishing in order to achieve a haze-free polished front surface in accordance with the prior art, for example using a soft polishing cloth with the aid of an alkaline polishing abrasive based on $SiO_2$, with from 0.1 to 1 μm of silicon being removed. If desired, a heat treatment of the silicon wafer may be introduced at any desired point in the process sequence, for example in order to destroy thermal donors, to anneal damage to crystal layers close to the surface or to bring about controlled dopant depletion. A range of further process steps which are required for certain products, such as the application of back-surface coatings of polysilicon, silicon dioxide or silicon nitride, or the application of an epitaxially grown layer of silicon or further semiconducting materials to the front surface of the silicon wafer can likewise be incorporated at suitable junctures in the process sequence using processes which are known to the person skilled in the art. Moreover, the silicon wafers may be provided with an unambiguous identification feature, for example a laser marking, at various points in the process sequence, for example before etching.

The polishing cloth used was a commercially available polyester fiber-reinforced polyurethane cloth with a hardness of 74 (Shore A). The aqueous polishing abrasive contained 3% by weight of $SiO_2$ and had a pH of 11.5. The temperature of the upper and lower polishing plates was in each case controlled at 38° C.

After the polishing had ended, a stopping agent, which contained 1% by volume of glycerol, 1% by volume of butanol and 0.07% by volume of surfactant, was supplied under reduced pressure. After cleaning and drying, visual inspection took place under haze light, and geometry measurement was carried out on a geometry-measuring appliance which operates according to the capacitive principle. Criteria for approval of the wafers processed in this way were the absence of surface scratches and a local flatness $SFQR_{max}$ of 0.12 μm for a surface grid of 25 mm×25 mm. Silicon wafers which did not satisfy these conditions were remachined in accordance with the prior art, with the additional removal of 5 μm of semiconductor material. The geometry-measuring appliance was also used to determine the thickness of the silicon wafers before and after polishing, from which information it is possible to determine the material-removal rate achieved by the polishing operation. The distribution of this removal of material over the front and back surfaces of the silicon wafers was determined using test wafers which had a laser marking, the depth of which was measured microscopically before and after polishing. The following table gives the relevant process data for Comparative Examples 1 to 3 (=C1 to C3; corresponds to the path curves illustrated in FIGS. 4 to 6) and Examples 1 to 3 (=E1 to E3, corresponding to the path curves shown in FIGS. 7 to 9). The inventive condition (a) for the path curve mean the absence of closed or virtually closed path curves with less than or equal to six loops; condition (b) means the absence of radii of curvature less than or equal to the radius of curvature of the inner drive ring. Both conditions must apply for the path curves of the silicon wafers relative to the upper and lower polishing plates.

| Example | $n_o$ (rpm) | $n_u$ (rpm) | $n_a$ (rpm) | $n_i$ (rpm) | $n_{LSrot}$ (rpm) | $n_{LStrans}$ (rpm) | $v_o$ (rpm) | $v_u$ (rpm) | Condition satisfied |
|---|---|---|---|---|---|---|---|---|---|
| C1 | +10.0 | −10.0 | +4.0 | −19.0 | 13.34 | −0.88 | −0.71 | +0.69 | (a) |
| C2 | +13.3 | −11.6 | +5.4 | −16.0 | 12.41 | +0.86 | −0.81 | +0.90 | (b) |
| C3 | +19.5 | −15.7 | +5.4 | −16.0 | 12.41 | +0.86 | −1.22 | +1.17 | (b) |
| E1 | +16.0 | −13.0 | +5.4 | −16.0 | 12.41 | +0.86 | −0.99 | +0.99 | (a) + (b) |
| E2 | +20.0 | −20.0 | +4.0 | −19.0 | 13.34 | −0.88 | −1.37 | +1.35 | (a) + (b) |
| E3 | +23.0 | −15.5 | +4.0 | −19.0 | 13.34 | −0.88 | −1.57 | +1.05 | (a) + (b) |

COMPARATIVE EXAMPLES AND EXAMPLES

Comparative examples and examples relate to the double-side polishing of silicon wafers with a diameter of 300 mm on a production scale. The silicon wafers were produced in accordance with the prior art by wire sawing of a single crystal, edge rounding, double-side sequential surface grinding, etching in a concentrated nitric acid/hydrofluoric acid mixture and edge polishing, and have a thickness of 805 μm. Using five carriers made from stainless chromium steel with a thickness of 770 μm, the three cutouts in which for receiving the silicon wafers were lined with PVDF, the silicon wafers were polished to a final thickness of 775 μm.

Relatively large quantities of silicon wafers were processed using the process conditions listed. First of all, polishing was carried out at a relatively low pressure, followed by polishing at a relatively high pressure. A new polishing cloth was used for each series of tests, in order to ensure uniform starting conditions. The table below gives the result with regard to the mean material-removal rates and the wafer quality after cleaning. FS=front surface; BS=back surface of the silicon wafers. Repolishing of wafers which are not to spec is taken into account in the relative process costs.

| Example | Polishing pressure (bar) | Material-removal rate (μm/min) | Distribution of material removed FS/BS (μm) | SFQRmax ≤0.12 μm | Surface scratches | Relative process costs |
|---|---|---|---|---|---|---|
| C1 | 0.125 | 0.48 | 15/15 | yes | no | 1.15 |
|  | 0.150 | 0.54 | 15/15 | yes | occasional | 1.24 |
|  | 0.200 | 0.68 | not determined | no | yes | >>1 |
| C2 | 0.150 | 0.58 | 14.5/15.5 | no | yes | >>1 |
| C3 | 0.125 | 0.58 | 15/15 | yes | no | 1.00 |
|  | 0.150 | 0.63 | 15/15 | 80% | no | 1.21 |
|  | 0.200 | 0.82 | not determined | no | yes | >>1 |
| E1 | 0.150 | 0.67 | 15/15 | yes | no | 0.90 |
| E2 | 0.125 | 0.66 | 15/15 | yes | no | 0.89 |
|  | 0.150 | 0.79 | not determined | yes | no | 0.81 |
|  | 0.200 | 1.02 | 15/15 | yes | no | 0.68 |
|  | 0.225 | 1.10 | not determined | 95% | no | 0.72 |
| E3 | 0.150 | 0.76 | 16.5/13.5 | yes | no | 0.82 |
|  | 0.200 | 0.97 | 17/13 | yes | no | 0.71 |

It can be seen from the table that the process according to the invention for the double-side polishing of silicon wafers has considerable cost benefits over processes according to the prior art, in particular when polishing pressures of greater than or equal to 0.15 bar are used.

Accordingly, while a few embodiments of the present invention have been shown and described, it is to be understood that many changes and modifications may be made thereunto without departing from the spirit and scope of the invention as defined in the appended claims.

What is claimed is:

1. A process for material-removing machining, on both sides simultaneously, of semiconductor wafers having a front surface and a back surface, comprising the steps of, resting the semiconductor wafers in carriers;

rotating said carriers by means of an annular outer drive ring and an annular inner drive ring;

moving said carriers between two oppositely rotating upper and lower working disks in a manner which is described by means of in each case a first path curve relative to the upper working disk and a second path curve relative to the lower working disk, wherein the first path curve and the second path curve
   (a) after six loops around a center each path curve has an appearance of still being open, and
   (b) at each point each path curve has a radius of curvature which is at least as great as a radius of the inner drive ring.

2. The process as claimed in claim 1, comprising carrying out material-removing machining on both sides simultaneously as double-side polishing, between an upper polishing plate and a lower polishing plate, which are each covered with a polishing cloth; and removing at least 2 μm of semiconductor material.

3. The process as claimed in claim 2, wherein the semiconductor wafers lie in cutouts, which are lined with plastic of substantially the same thickness as the carrier, in a plurality of planar carriers made from steel, said planar carriers having a mean thickness which is 2 to 20 μm less than a mean thickness of finished polished semiconductor wafers.

4. The process as claimed in claim 2, wherein the rate at which semiconductor material is removed is at least 0.65 μm/min.

5. The process as claimed in claim 3, wherein the mean thickness of the carriers is 3 to 10 μm less than the mean thickness of the finished polished semiconductor wafers, and the amount of semiconductor material removed is 5 to 50 μm.

6. The process as claimed in claim 3, comprising polishing at least three semiconductor wafers simultaneously and using at least three carriers simultaneously.

7. The process as claimed in claim 2, comprising using an upper polishing cloth and a lower polishing cloth, which each substantially comprise polyurethane and have a hardness of 50 to 100 (Shore A); and supplying continuously a polishing abrasive having an $SiO_2$ solids content of 1 to 5% by weight based upon the total abrasive weight and a pH of 9.5 to 12.5.

8. The process as claimed in claim 2, wherein, through the selection of similar mean path velocities of semiconductor wafers relative to the upper polishing plate and to the lower polishing plate, approximately the same amount of material is removed from the front surface and the back surface.

9. The process as claimed in claim 2, wherein, through selection of a higher mean path velocity of semiconductor wafers relative to the upper polishing plate compared to mean path velocity relative to the lower polishing plate, more material is removed from a front surface of the semiconductor wafer than from a back surface.

10. The process as claimed in claim 1, comprising carrying out the material-removing machining on both sides simultaneously as a double-side lapping step between two lapping wheels; and removing at least 10 μm of semiconductor material being removed.

11. The process as claimed in claim 10, wherein the semiconductor wafers lie in plastic-lined cutouts in planar carriers made from steel, and moving said wafers between two lapping wheels made from steel, with channel-like recesses, while supplying a suspension which contains abrasive particles.

12. The process as claimed in claim 10, comprising removing the same amount of material from a front surface and a back surface.

13. The process as claimed in claim 1, comprising carrying out the material-removing machining on both sides simultaneously as a double-side grinding step between two working disks which are covered by abrasive bodies; and removing at least 10 μm of semiconductor material.

14. In a method for the manufacture of semiconductor wafers made from silicon with a local flatness $SFQR_{max}$ of less than or equal to 0.13 μm, based on a component surface area of 25 mm×25 mm, the improvement which comprises utilizing the process as claimed in claim 1 for the production of said wafers.

* * * * *